United States Patent
Rao et al.

(10) Patent No.: US 10,749,505 B2
(45) Date of Patent: Aug. 18, 2020

(54) HIGH-SPEED TRANSMITTER INCLUDING A MULTIPLEXER USING MULTI-PHASE CLOCKS

(71) Applicant: Avago Technologies International Sales Pte. Ltd., Singapore (SG)

(72) Inventors: Lakshmi Rao, Irvine, CA (US); Anand J. Vasani, Irvine, CA (US); Ali Nazemi, Irvine, CA (US); Jun Cao, Irvine, CA (US)

(73) Assignee: Avago Technologies International Sales Pte. Ltd., Singapore (SG)

( * ) Notice: Subject to any disclaimer, the term of this patent is extended or adjusted under 35 U.S.C. 154(b) by 98 days.

(21) Appl. No.: 16/165,578

(22) Filed: Oct. 19, 2018

(65) Prior Publication Data

US 2020/0127645 A1 Apr. 23, 2020

(51) Int. Cl.
| | | |
|---|---|---|
| *H03K 3/012* | (2006.01) | |
| *H04J 3/06* | (2006.01) | |
| *H03K 19/20* | (2006.01) | |
| *H03K 3/037* | (2006.01) | |
| *H04L 7/033* | (2006.01) | |
| *H04J 3/04* | (2006.01) | |
| *H03M 9/00* | (2006.01) | |
| *H04L 25/14* | (2006.01) | |
| *H04L 7/00* | (2006.01) | |

(52) U.S. Cl.
CPC ............ *H03K 3/012* (2013.01); *H03K 3/037* (2013.01); *H03K 19/20* (2013.01); *H04J 3/06* (2013.01); *H03M 9/00* (2013.01); *H04J 3/04* (2013.01); *H04J 3/0617* (2013.01); *H04L 7/0025* (2013.01); *H04L 7/033* (2013.01); *H04L 25/14* (2013.01)

(58) Field of Classification Search
CPC ........ H03K 3/012; H03K 3/037; H03K 19/20; H04J 3/06; H04J 3/04; H04J 3/0617; H04L 7/0025; H04L 25/14; H04L 7/033; H03M 9/00
See application file for complete search history.

(56) References Cited

U.S. PATENT DOCUMENTS

| | | | | |
|---|---|---|---|---|
| 8,873,606 | B2 * | 10/2014 | Zhang ................. | H03D 3/02 375/219 |
| 10,033,520 | B2 * | 7/2018 | Garg ................... | H04L 7/033 |
| 10,069,508 | B1 * | 9/2018 | Zhang ................. | H03M 1/66 |
| 10,129,016 | B2 * | 11/2018 | Nguyen ............... | H04J 3/0635 |
| 10,277,210 | B1 * | 4/2019 | Rhew .................. | H03M 1/0836 |
| 10,542,312 | B1 * | 1/2020 | Bassett ............... | H04L 7/0025 |

(Continued)

OTHER PUBLICATIONS

Bae et al., A 6-to-32 Gb/s Voltage-Mode Transmitter with Scalable Supply, Voltage Swing, and Pre-Emphasis in 65-nm CMOS, IEEE, 2016, 4 pages.

(Continued)

*Primary Examiner* — Brian T O Connor
(74) *Attorney, Agent, or Firm* — Foley & Lardner LLP

(57) ABSTRACT

Systems and methods for data multiplexing include or use a data serializer having a first set of four serializer outputs and a second set of four serializer outputs. The systems and methods also use or include a pair of 4 to 1 multiplexers each having four first multiplexer inputs and one first multiplexer outputs and a 2 to 1 multiplexer having two multiplexer inputs and one multiplexer output.

20 Claims, 7 Drawing Sheets

(56) References Cited

U.S. PATENT DOCUMENTS

| | | | |
|---|---|---|---|
| 10,560,097 B1* | 2/2020 | Peng | H03L 7/0814 |
| 2015/0010044 A1* | 1/2015 | Zhang | H03D 3/02 |
| | | | 375/219 |
| 2019/0245637 A1* | 8/2019 | Toyoda | H04L 7/04 |
| 2020/0036402 A1* | 1/2020 | Kansal | H03L 7/099 |

OTHER PUBLICATIONS

Cao et al., A Transmitter and Receiver for 100Gb/s Coherent Networks with Integrated 4?64GS/s 8b ADCs and DACs in 20nm CMOS, IEEE International Solid-State Circuits Conference, Feb. 2017, 3 pages.

Dickson et al., A 1.4 pJ/bit, Power-Scalable 16x12 Gb/s Source-Synchronous I/O With DFE Receiver in 32 nm SOI CMOS Technology, IEEE Journal of Solid-State Circuits, vol. 50, No. 8, Aug. 2015, 15 pages.

Kim et al., A 112Gb/s PAM-4 Transmitter with 3-Tap FFE in 10nm CMOS, IEEE International Solid-State Circuits Conference, Feb. 2018, 3 pages.

Kim et al., A 16-to-40Gb/s Quarter-Rate NRZ/PAM4 Dual-Mode Transmitter in 14nm CMOS, IEEE International Solid-State Circuits Conference, Feb. 2015, 3 pages.

Nazemi et al., A 36Gb/s PAM4 Transmitter Using an 8b 18GS/s DAC in 28nm CMOS, IEEE International Solid-State Circuits Conference, Feb. 2015, 3 pages.

Raghavan et al., A Sub-2W 39.8-to-44.6Gb/s Transmitter and Receiver Chipset with SFI-5.2 Interface in 40nm CMOS, IEEE International Solid-State Circuits Conference, Feb. 2013, 3 pages.

Steffan et al., A 64Gb/s PAM-4 Transmitter with 4-Tap FFE and 2.26pJ/b Energy Efficiency in 28nm CMOS FDSOI, IEEE International Solid-State Circuits Conference, Feb. 2017, 3 pages.

Zheng et al., A 5-50 Gb/s Quarter Rate Transmitter with a 4-Tap Multiple-MUX based FFE in 65 nm CMOS, IEEE, 2016, 4 pages.

* cited by examiner

HIGH-SPEED TRANSMITTER INCLUDING A MULTIPLEXER USING MULTI-PHASE CLOCKS

FIELD OF THE DISCLOSURE

The present disclosure relates generally to the field of communication including but not limited to field of systems and methods for data multiplexing or a data multiplexer (MUX).

BACKGROUND

Communications utilize high-speed transceivers. For example, high-speed transceivers are used in network switches, data centers, and other network devices. High-speed transceivers utilize data multiplexers (MUXS) to serialize data. As demand for data rates increases to 50 gigabits per second (Gbps) and higher, an extremely low-power, low-area transmitter capable of operating at such rates is desired. Data MUXS often utilize latches and data flip flops in multiple stages which are clocked for data serialization, alignment, and returning. Clock signal distribution and latches and flip flops used for data consume power and take up integrated circuit (IC) area.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements, and.

DETAILED DESCRIPTION

Figure 1:
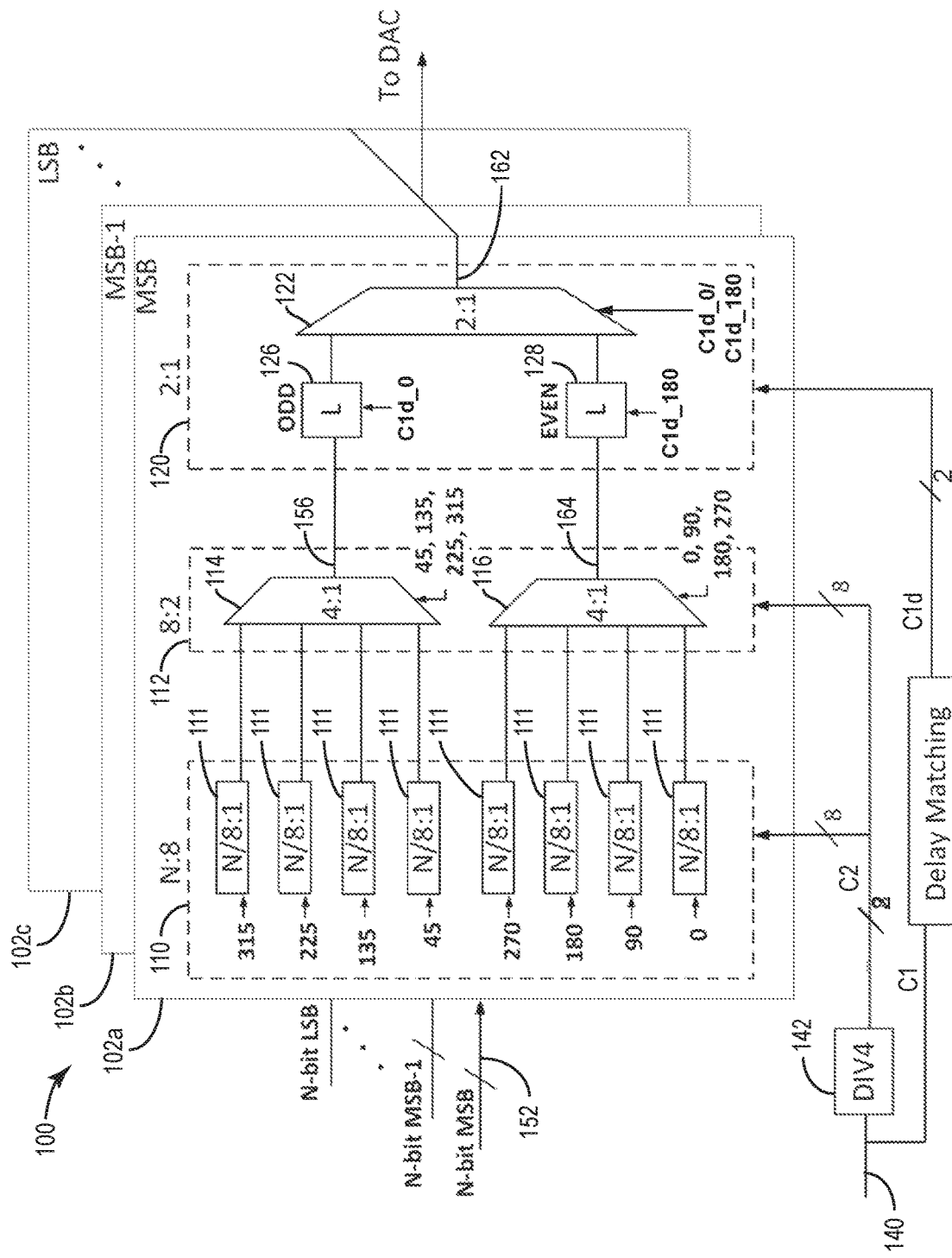
FIG. 1 is a general schematic block diagram of a communication system including a multiplexing system which includes a set of data serializers, a pair of 4 to 1 MUXS and a 2 to 1 MUX according to some embodiments.

Before turning to the features, which illustrate the exemplary embodiments in detail, it should be understood that the application is not limited to the details or methodology set forth in the description or illustrated in the figures. It should also be understood that the terminology is for the purpose of description only and should not be regarded as limiting.

Referring generally to the figures, systems and methods for providing data multiplexing operations which can be used to serialize data. In some embodiments, the systems and methods are used in various communication system components including but not limited to network switches, data centers, and other network devices. In some embodiments, a data multiplexing system serializes data in a high-speed transceiver to enable an extremely low-power, low-area transmitter capable of operating at high rates. In some embodiments, the transmitter is a 50 gigabits per second (Gbps) and higher transmitter and the data multiplexing system is provided before the digital to analog converter (DAC) of the transmitter.

In certain implementations, nearly two thirds of power consumption for the data multiplexing operation is consumed on clocking and clock distribution to all the latches and data flip flops used in data serialization, retiming, and alignment operations. In certain transmitter applications, clock loading and clock distribution increases linearly with the number of input bits and the number bits of the DAC. The data multiplexing system generally has two speed limiting factors: (1) timing margin at the input of the data multiplexing system which is limited by data routing and data coupling that increases data delay and (2) bandwidth at the output of the data multiplexing system which is limited by the self-loading of the MUX. Of the area on the IC for the multiplexing system, 60-70% of the area is used for data routing between stages of the data multiplexing system. In some embodiments, the architecture of the data multiplexing system advantageously reduces the active area for the data multiplexing operation on the IC in-turn reducing the routing area. The reduction in the active area achieves lower power consumption for the data multiplexing system in some embodiments.

In some embodiments, a data multiplexing system includes a data serializer, a pair of 4 to 1 MUXS and a 2 to 1 MUX. The data serializer and the pair of 4 to 1 MUXs is clocked using eight phase signals derived from a $\frac{1}{8}^{th}$ rate clock signal, and the 2 to 1 MUX is clocked by a half rate clock signal in some embodiments. By using the eight phase signals, data is released 2T (where T is the full-rate clock period or the bit-period at the transmitter output) earlier by the data serializer than in conventional systems in some embodiments. In some embodiments, the data alignment at interfaces between the pair of 4 to 1 MUXs and the 2 to 1 MUX and between the pair of 4 to 1 MUXs and the data serializer is done using the eight phase signals, thereby eliminating alignment latches at these interfaces. The 2 to 1 MUX is advantageously symmetric in some embodiments (e.g., because the aligning latch is eliminated). Alignment is done by using 0 and 45 degree phase signals, 90 and 135 degree phase signals, 180 and 215 degree phase signals, and 270 and 315 phase signals in some embodiments. The data multiplexing system receives single-ended signals from the data serializers and provides differential signals before the driver or DAC in some embodiments.

By using the eight phase signals, the load is evenly distributed, and power consumption and phase offset is reduced in the clock divider for the eight phase signals in some embodiments. A 50% larger timing window exists at the interface between the pair of 4 to 1 MUXS and the data serializer, which is 120 ps at the 6.25 GHz $\frac{1}{8}^{th}$ rate clock signal in some embodiments. The data serializer is an N/8 to 1 latch-based serializer in some embodiments. The 4 to 1 MUXS share combined and simplified MUX logic in some embodiments.

Some embodiments relate to a multiplexing system. The multiplexing system includes a data serializer having a first set of four serializer outputs and a second set of four serializer outputs. The data multiplexer also includes a first 4 to 1 multiplexer having four first multiplexer inputs and one first multiplexer output. The first multiplexer inputs are coupled to the first set of four serializer outputs. The data multiplexer also includes a second 4 to 1 multiplexer having four second multiplexer inputs and one second multiplexer outputs. The second multiplexer inputs are coupled to the second set of four serializer outputs. The data multiplexer also includes a 2 to 1 multiplexer having two third multiplexer inputs and one third multiplexer output. The first multiplexer output is coupled to one of the third multiplexer inputs, and the second multiplexer output is coupled to the other of the third multiplexer inputs. The 2 to 1 multiplexer receives a first clock signal at a first rate, and the first 4 to 1 multiplexer and the second 4 to 1 multiplexer receive a second clock signal at a second rate, the first rate being four times as fast as the second rate. The first 4 to 1 multiplexer selects data according to a first set of four of eight phases of the second clock signal, and the second 4 to 1 multiplexer selects data according to a second set of four of the eight phases of the second clock signal.

Some embodiments relate to a method serializing data. The method includes receiving at four first multiplexer inputs of a first 4 to 1 multiplexer a first set of first four bits, receiving at four second multiplexer inputs of a second 4 to 1 multiplexer a set of second four bits, and providing one of the first four bits to a first multiplexer output of the first 4 to 1 multiplexer coupled to a third multiplexer input of a 2 to 1 multiplexer in response to four first phase signals associated with a second clock signal. The method also includes providing one of the second four bits to a second multiplexer output of the second 4 to 1 multiplexer coupled to a fourth multiplexer input of the 2 to 1 multiplexer in response to four second phase signals of the second clock signal, providing the one of the first four bits at the third multiplexer input to a third multiplexer output of the 2 to 1 multiplexer in response to a first clock signal, and providing the one of the second four bits at the fourth multiplexer input to the third multiplexer output of the 2 to 1 multiplexer in response to the first clock signal. The first clock signal is at a first rate, and the second clock signal is at a second rate. The first rate is four times as fast as the second rate.

Some embodiments relate to a communication integrated circuit. The communication integrated circuit includes a first 4 to 1 multiplexer having four first multiplexer inputs and one first multiplexer outputs, a second 4 to 1 multiplexer having four second multiplexer inputs and one second multiplexer outputs, and a 2 to 1 multiplexer having two third multiplexer inputs and one third multiplexer output. The first multiplexer output is coupled to one of the third multiplexer inputs, and the second multiplexer output is coupled to the other of the third multiplexer inputs. The 2 to 1 multiplexer receives a first clock signal at a first rate, and the first 4 to 1 multiplexer and the second 4 to 1 multiplexer receives a second clock signal at a second rate. The first rate is four times as fast as the second rate. The first 4 to 1 multiplexer selects data according to a first set of four of eight phase signals of the second clock signal, and the second 4 to 1 multiplexer selects data according to a second set of four of the eight phase signals of the second clock signal.

With reference to FIG. 1, an IC communication system 100 is a high speed data transceiver for wireless or network applications. The IC communication system 100 includes multiplexing systems 102*a*, 102*b*, and 102*c*. The multiplexing systems 102*a*, 102*b*, and 102*c* process N-bit packages of data (e.g. bytes) being serialized for transmission. N can be any integer. The number of packages and multiplexing systems 102*a-c* can be from 1 to M depending upon system requirements, wherein M is any integer. The serialized data can be provided to a digital-to-analog converter (DAC) in some embodiments. In some embodiments, M is the number of DAC bits. If M is 1, the DAC is a simple driver in some embodiments.

Each of the multiplexing systems 102*a-c* converts a number (N, e.g., an integer multiple of 8) of parallel bits (e.g., 40) into a serial one bit stream of data in some embodiments. The multiplexing systems 102*a*, 102*b*, and 102*c* are similar in structure and operation to each other. Only the detailed structure and the operation of the multiplexing system 102*a* is discussed below for brevity.

The multiplexing system 102*a* includes a set 110 of eight N/8:1 data serializers 111, a pair 112 of MUXS 114 (e.g., four-to-one MUXS) and 116, and a MUX circuit 120. The MUX circuit 120 includes a MUX 122 (e.g., two to one MUX), a latch 126, and a latch 128. The multiplexing system 102*a* also includes a clock input 140, a divider circuit 142, and a delay matching circuit 144. The pair 112 can be an 8 to 2 MUX in some embodiments. In some embodiments, the 4 to 1 MUXS 114 and 116 provides a 50 percent larger timing margin over a 2 to 1 MUX operating at the same clock rate.

A clock signal C1 is provided at a clock input 140. The clock signal C1 is a half speed signal compared to the clock signal for the IC in some embodiments. The clock signal C1 has a period of 2T, where T is the period of the clock signal for the IC. The clock signal C1 is provided to the divider circuit 142 which provides a clock signal C2 to the set 110 of data serializers 111 and to the pair 112 of MUXS 114 and 116. The clock rate of the clock signal C1 is divided by an integer L in the divider circuit 142, where L is any number from 2 to 15 (e.g., 4). The clock signal C2 has a clock rate of one quarter of the clock rate of the clock signal C1.

In some embodiments, the clock signal C2 from the divider circuit 142 is converted into eight separate phase signals which are fed to the data serializers 111 (one phase signal per data serializer 111) and to the pair 112 of the MUXS 114 and 116. For example, the first data serializer 111 receives the zero phase signal and the eighth data serializer receives the 315 degree phase delay signal. The eight phase signals are eight pulse signals at the frequency of the clock signal C2 and are derived from the clock signal C2. Each pulse for each phase signal is spaced apart by a set number of degrees from the neighboring pulse (e.g., 45 degrees). The pulse width of the pulse of each phase signal is 4T in some embodiments.

In some embodiments, the data MUX 114 receives four of the eight phase signals provided by the divider circuit 142 (e.g. phases 45, 135, 225 and 315) and the MUX 116 receives four of the eight phase signals provided by the divider circuit 142 (e.g., phases 0, 90, 180 and 270). The data MUX 114 sequentially selects the data from its four inputs to provide to an output 156 in response to the set of four phase signals. The MUX 116 sequentially selects the data from its four inputs to provide to an output 164 in response to the set of four phase signals.

The clock signal C1 at the input 140 is provided through the delay matching circuit 144 to the MUX circuit 120. The delay matching circuit 144 provides a delayed clock signal C1*d*. A 0 degree phase delayed signal of the clock signal C1*d* and a 180 degree phase delay signal provided to the 2 to 1 MUX 122. The latch 126 receives the 0 degree phase delayed signal from the delay matching circuit 144 and the latch 128 receives the 180 degree phase delayed signal from the delay matching circuit 144. The latch 126 latches the data at the output 156 in response to the 0 degree phase delayed signal. The latch 128 latches the data at the output 164 in response to the 0 degree phase delayed signal.

The divider circuit 142 can be any circuit for providing a divided clock rate and generating phase signals derived from the clock signal C1. The divider circuit 142 is a flip-flop, latch and logic circuit configured to provide eight phase delayed signals in some embodiments. In some embodiments, the divider circuit 142 is an analog frequency divider, a phase locked loop (PLL), or other circuit for provided clock division and pulse signal generation at the appropriate phases.

The delay matching circuit 144 can be any circuit for providing a delayed clock signal and generating phase signals derived from the clock signal C1. The delay matching circuit 144 includes a delay circuit which provides a delay associated with propagation through portions of the multiplexing system 102a (e.g., through the divider circuit 142, the set 110, and the pair 112). The delay circuit can include inverters, gates, or flip flops for providing the appropriate delay.

An N-bit data set is provided at inputs 152 and received at inputs to the data serializers 111. The data serializers 111 provide data to four inputs of the MUX 114 and four inputs for the MUX 116 in response to eight phase signals of the clock signal C2 provided by the divider circuit 142. The MUX 114 selects the data or bit at one of its four inputs for provision at output 156 in response to four phase signals of the clock signal C2 provided by the divider circuit 142. Similarly, the MUX 116 provides the data at one of its four inputs in response to other four phase signals of the clock signal C2 provided by the divider circuit 142. The MUX circuit 120 is configured to sequentially select the output 156 of the MUX 114 and the output 164 of the MUX 116.

The latches 126 and 128 serve to ensure appropriate timing for the data received from the outputs 156 and 164 and are clocked by the 0 degree phase signal and the 180 degree phase signal of the clock signal C1d, respectively. The MUX 122 selects the data from the latch 126 or the data from the latch 128 in response to the clock signal C1d provided by the delay matching circuit 144. The selected data is provided at an output 162 for use by other circuitry for the system 100 (such as a DAC).

Data alignment between the data serializers 111 and the pair 112 of MUXS 114 and 116 is performed using the eight phase signals of the clock signal C2 thus eliminating aligning latches. Using the eight phase signals of the clock signal, data is released a period of 2T earlier than by conventional systems. Data alignment at the interface between the pair 112 and the MUX circuit 120 is performed using the eight phase signals.

Figure 2:
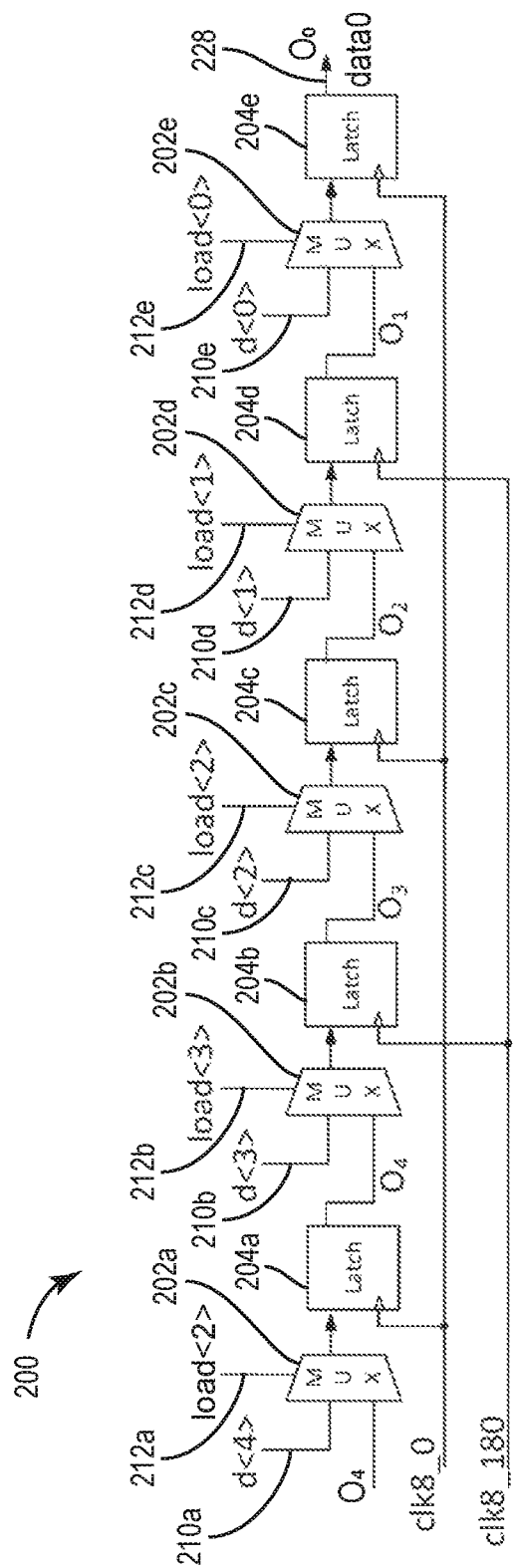
FIG. 2 is an electrical schematic drawing of one of the data serializers for the multiplexing system illustrated in FIG. 1 according to some embodiments.
Figure 7:
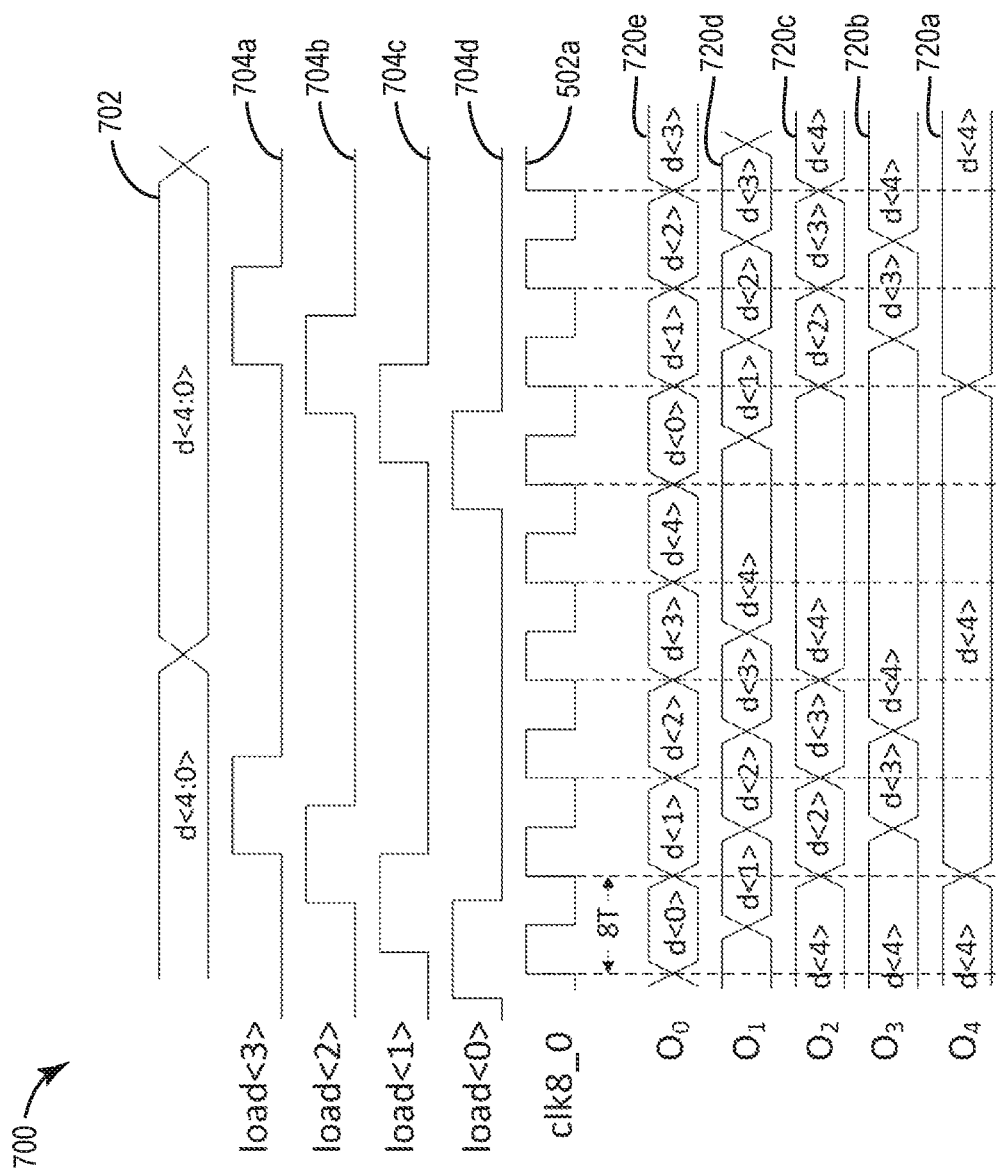
FIG. 7 is a timing diagram for the data serializer illustrated in FIG. 2 according to an exemplary embodiment.

With reference to FIGS. 2 and 7, a portion 200 of an N/eight-to-one data serializer 111 (e.g., the bottom most data serializer 111 in FIG. 2) includes MUXS 202a-e and latches 204a-e. The portion 200 provides data D<0-4> as signals 702 to an output 228 as data data0 (a signal 720e in FIG. 7) according to an exemplary timing diagram 700 (FIG. 7). The portion 200 is shown as a 5:1 data serializer for simplicity. The MUXS 202a-e select data D<0-4> at inputs 210a-e (corresponding to inputs 152 in FIG. 1) in response to load signals LOAD<0-3> at inputs 212a-e. The load signals LOAD<0-3> (signals 704a-d in FIG. 7) are provided at a clock rate of 1/Z of the clock signal C2, where Z is an integer representing the number of stages of the portion 200 (e.g., 40). Once loaded, the MUXS 202a-e select the data D<0-4> from the prior latch 204a-e in response to the LOAD<0-3> signals.

The 0 degree phase signal (signal 502a, FIGS. 6 and 7) derived from the clock signal C2 and the 180 degree phase signal derived from the clock signal C2 (e.g., the signal 502c in FIG. 6) are used to clock the data D<0-4> through the latches 204a-e to provide to the output 228 coupled to one of the inputs of the MUXs 114 to 116. The latches 204a-e provide outputs $O_4$-$O_0$ (signals 720a-e, respectively, in FIG. 7). The latches 204a, 204c and 204e are clocked by a zero phase degree signal (the signal 502a), and latches 204b and 204d are clocked by a 180 phase signal (the signal 502c). The data serializers 111 according to the architecture of the portion 200 reduce latch count by 50 percent compared to data flip-flop based data serializers and reduce loading on the phase clock and latency in the data paths in some embodiments.

Figure 3:
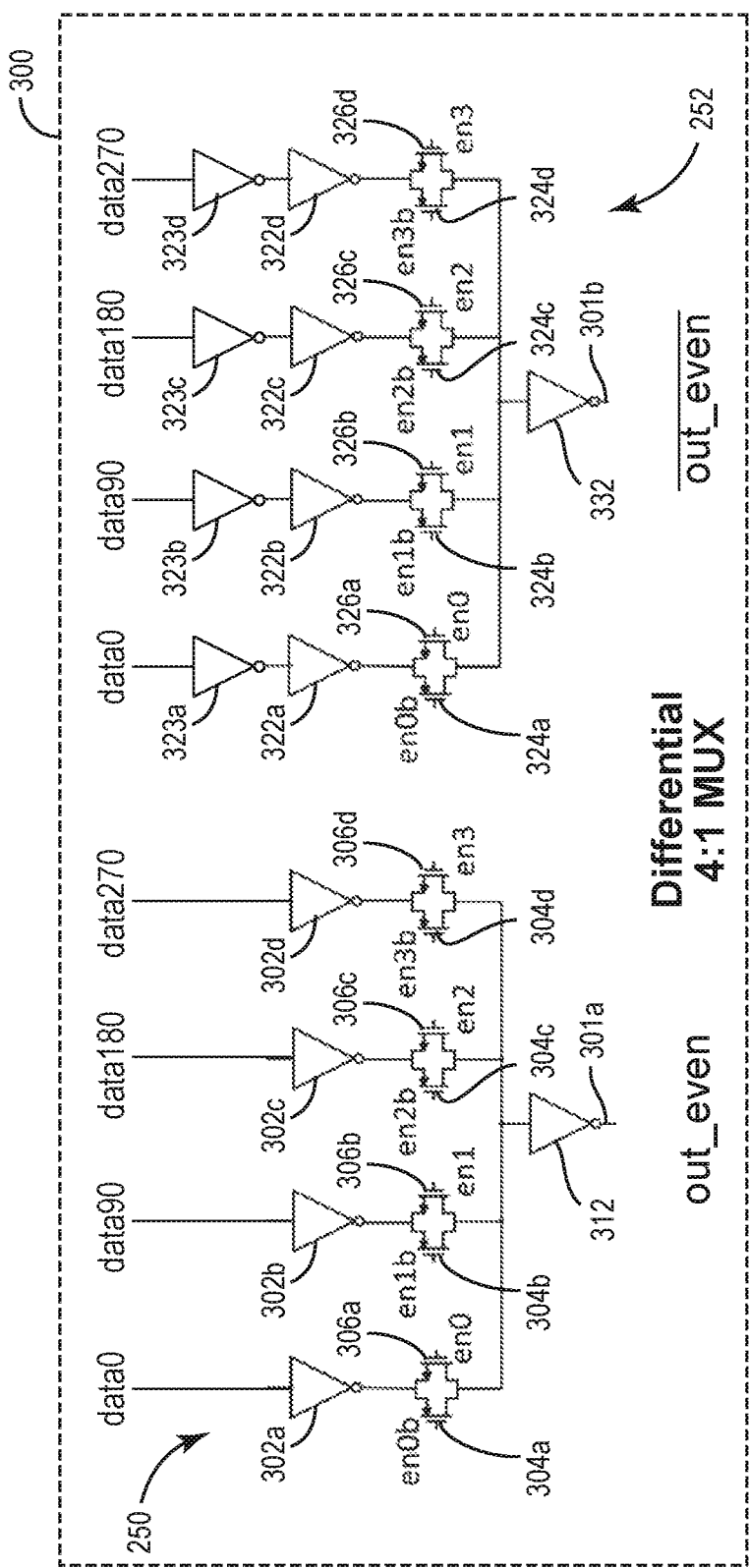
FIG. 3 is an electrical schematic drawing of one of the pair of 4 to 1 MUXS for the multiplexing system illustrated in FIG. 1 according to some embodiments.

With reference to FIG. 3, a MUX 300, which can be used as one of the MUXs 114 and 116 of FIG. 1, receives single ended data or signals at inputs 250 and selects one of the signals on the inputs 250 for provision as a differential signal on a differential output 252. The MUX 300 is a differential 4 to 1 MUX in some embodiments. The MUX 300 includes an inverter 302a, an inverter 302b, an inverter 302c an inverter 302d, a pass gate 304a, a pass gate 304b, a pass gate 304c, a pass gate 304d, a pass gate 306a, a pass gate 306b, a pass gate 306c, a pass gate 306d and an inverter 312. The MUX 300 also includes inverters 322a-d similar to inverters 302a-d, inverters 323a-d similar to inverters 302a-d, pass gates 324a-d and 326a-d similar to respective pass gates 304a-d and 306a-d, and an inverter 332.

The pass gate 304a and 306a are respectively controlled by an enable 0b signal and an enable 0 signal. Similarly, pass gate 304b and 306b are controlled by an enable 1b signal and an enable 1 signal, respectively. Pass gates 304c and 306c are controlled by an enable 2b signal and enable 2 signals, respectively. Pass gates 304d and 306d are controlled by enable 3b signal and enable 3 signals, respectively. Pass gates 324a-d and 326a-d are similarly controlled.

In some embodiments, the pass gates 304a-d are P channel metal oxide semiconductor field effect transistors (MOSFETS), and the pass gates 306a-d are N channel MOSFETS. The pass gates 304a-d and 306a-d are coupled in parallel in respective pairs. The differential output 252 includes differential outputs 301a and 301b. The inverter 312 provides the positive data signal at the output 301a for the MUX 300 and the negative data signal at the output 301b for the MUX 300.

Figure 4:
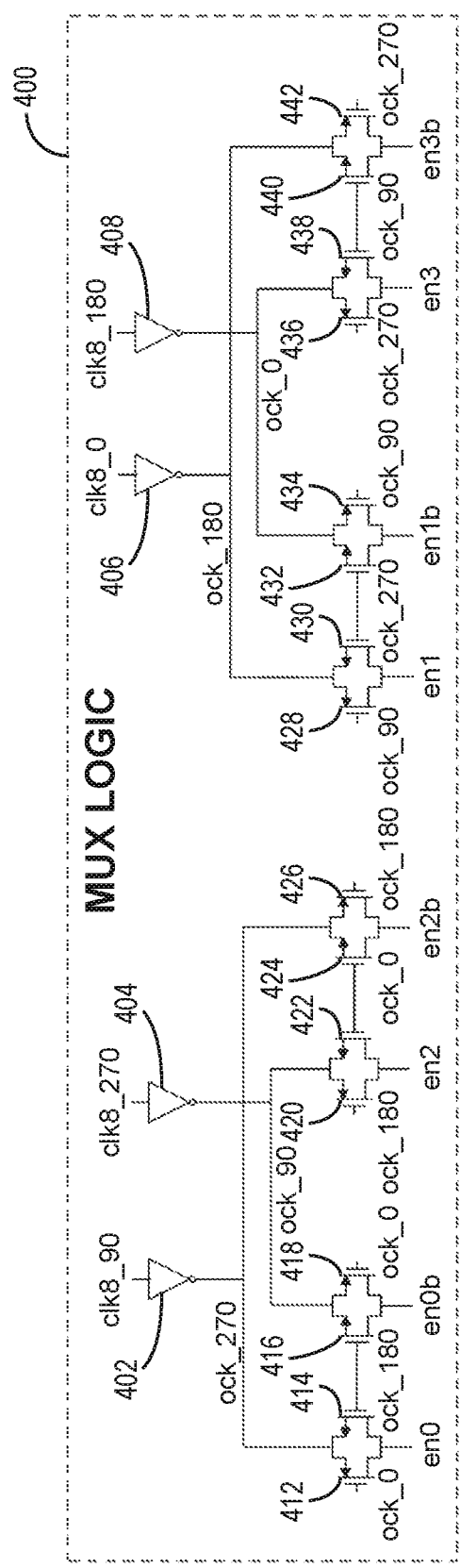
FIG. 4 is an electrical schematic drawing of MUX logic for the one of the pair of 4 to 1 MUXS illustrated in FIG. 3 according to some embodiments.

With reference to FIG. 4, the enable signals (e.g. enable 0, enable 0b, enable 2, enable 2b, enable 1, enable 1b, enable 3 and enable 3b) are provided by a MUX logic circuit 400. The MUX logic circuit 400 is for a differential 4 to 1 MUX in some embodiments. The MUX logic circuit 400 provides the enable signals in response to four of the eight phase signals from the divider circuit 142 (FIG. 1). The enable signals are provided to sequentially select the inputs 250 (FIG. 3) for provision at the outputs 301a and 301b. In some embodiments, the MUX logic circuit 400 uses the 0, 90, 270 and 180 degree phase signals to provide the enable 0, enable 0b, enable 2, enable 2b, enable 1, enable 1b, enable 3 and enable 3b signals.

The MUX logic circuit 400 includes an inverter 402, an inverter 404, an inverter 406 and an inverter 408. The MUX logic circuit 400 also includes pass gates 412, 414, 416, 418, 420, 422, 424, 426, 428, 430, 432, 434, 436, 438, 440 and 442. In some embodiments, the pass gates 412, 418, 420, 426, 428, 434, 436, and 442 are P MOSFETS, and the pass gates 414, 416, 422, 424, 430, 432, 438, and 440 are N channel MOSFETS.

The pass gates 412, 411, 416, 418, 420, 422, 424, 426, 428, 430, 432, 434, 436, 438 and 440 are coupled in parallel in respective pairs and arranged for AND or NAND logic functions to generate the enable signals. The pass gates 422 and 418 are controlled by the zero phase clock signal, and the pass gates 414 and 416 are controlled by the 180 degree phase signal. The pass gates 420 and 426 are controlled by the 180 degree phase signals, and the pass gates 422 and 424 are controlled by the 0 degree phase signal. The pass gates 428 and 434 are controlled by the 90 degree phase signal, and the pass gates 430 and 432 are controlled by the 270 degree phase signal. The pass gates 436 and 442 are controlled by 270 degree phase signal, and the pass gates 438 and 440 are controlled by the 90 degree phase signal.

The pass gates 412, 414, 424 and 426 receive an inverted 90 degree phase signal from the inverter 402, and the pass gates 416, 418, 420 and 422 receive an inverted 270 degree phase signal from the inverter 404. The pass gates 428, 430, 440 and 442 receive an inverted 0 degree phase signal from the inverter 406, and the pass gates 432, 434, 436 and 438 receive an inverted 180 degree phase signal from the inverter 408. The pass gates 412 and 414 provide the enable 0 signal, and pass gates 416 and 418 provide the enabled 0$b$ signal. The pass gates 420 and 422 provide the enable 2 signal. The pass gates 424 and 426 provide the enable 2$b$ signal. The pass gates 428 and 430 provide the enable 1 signal. The pass gates 432 and 434 provide the enable 1$b$ signal. The pass gates 436 and 438 provide the enable 3 signal, and pass gates 440 and 442 provide the enable 3$b$ signal.

A similar MUX logic circuit is provided for the other 4 to 1 MUX and generates enable signals in response to other phase signals (e.g., phases 45, 135, 225, and 315). In some embodiments, the MUX logic circuit for 114 with differential outputs uses phase signals 0, 90, 180, and 270 and the MUX logic circuit for the MUX 116 with differential outputs uses phase signals 45, 135, 225, and 315. In some embodiments, the logic circuitry for the differential outputs of the same 4 to 1 MUX is shared.

MUX logic circuit 400 and MUX 300 can be built narrow and tall (e.g., a differential 4-to-1 MUX is only 26 fingers wide) in some embodiments. A compact layout reduces data and clock routing distances at interfaces between MUXS 114 and 116 and serializers 111 and between latched 126 and 128 and MUXS 114 and 116. The reduced span allows for pitch-matching bits between MUXS 114 and 116 and MUX 122 and a DAC.

Figure 5:
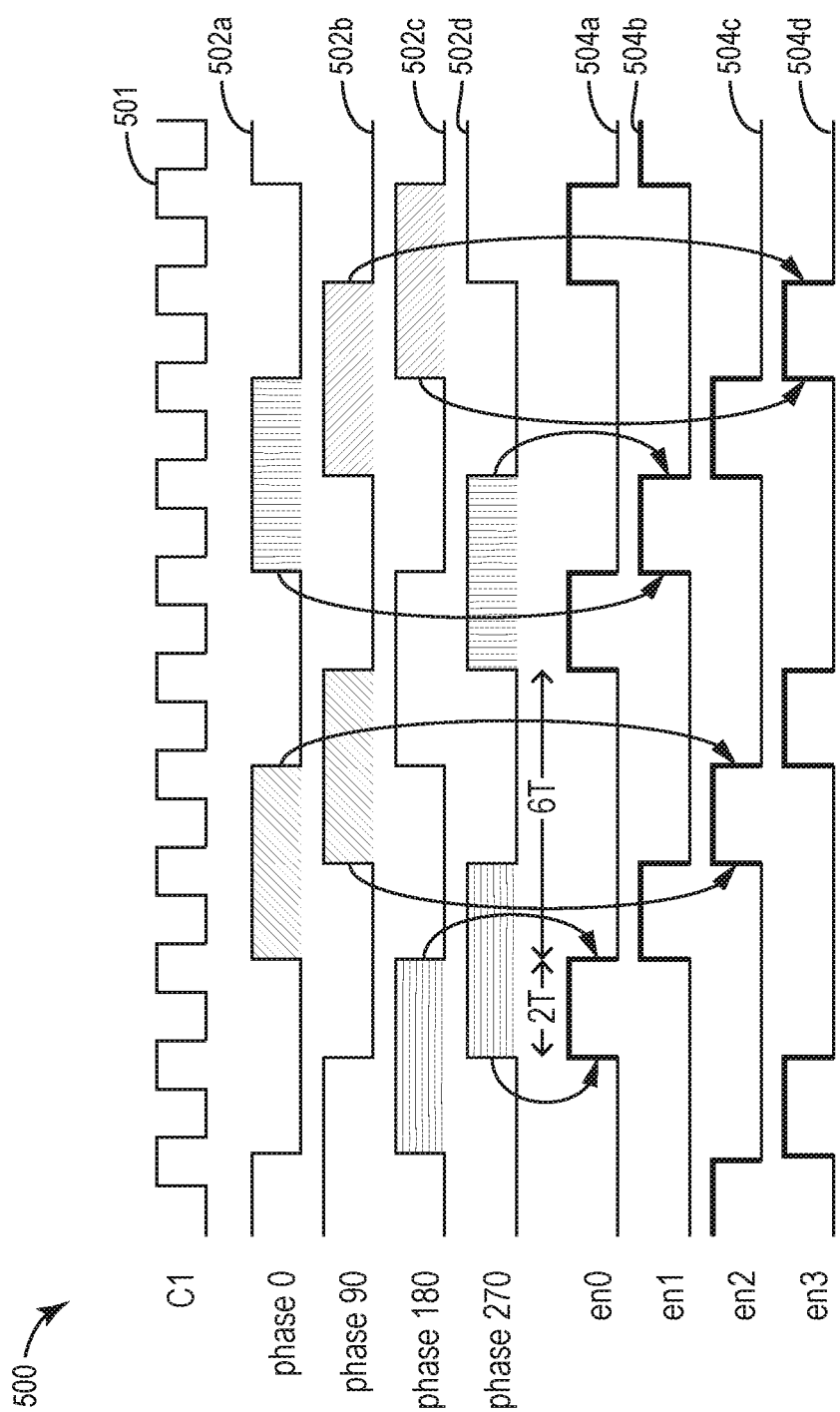
FIG. 5 is a timing diagram for the MUX logic illustrated in FIG. 4 according to some embodiments.

With reference to FIG. 5, the MUX logic circuit 400 is configured to provide the enable signals according to the timing diagram 500. The timing diagram 500 includes exemplary phase signals 502$a$-$d$ corresponding to phases 0, 90, 180, and 270 and exemplary enable signals 504$a$-$d$ corresponding to enable 0, enable 1, enable 2, and enable 3. The enable 0$b$, 1$b$, 2$b$ and 3$b$ signals are inverted signals with respect to the respective enable signals 0, 1, 2, and 3 in some embodiments. The enable signals 504$a$-$d$ are pulse signals having a pulse width of 2T and a period of 8T, and the phase signals 502$a$-$d$ are pulse signals having a pulse width of 4T and a period of 8T. The enable 0$b$, 1$b$, 2$b$ and 3$b$ are pulse signals having a pulse width of 6T and a period of 8T.

Figure 6:
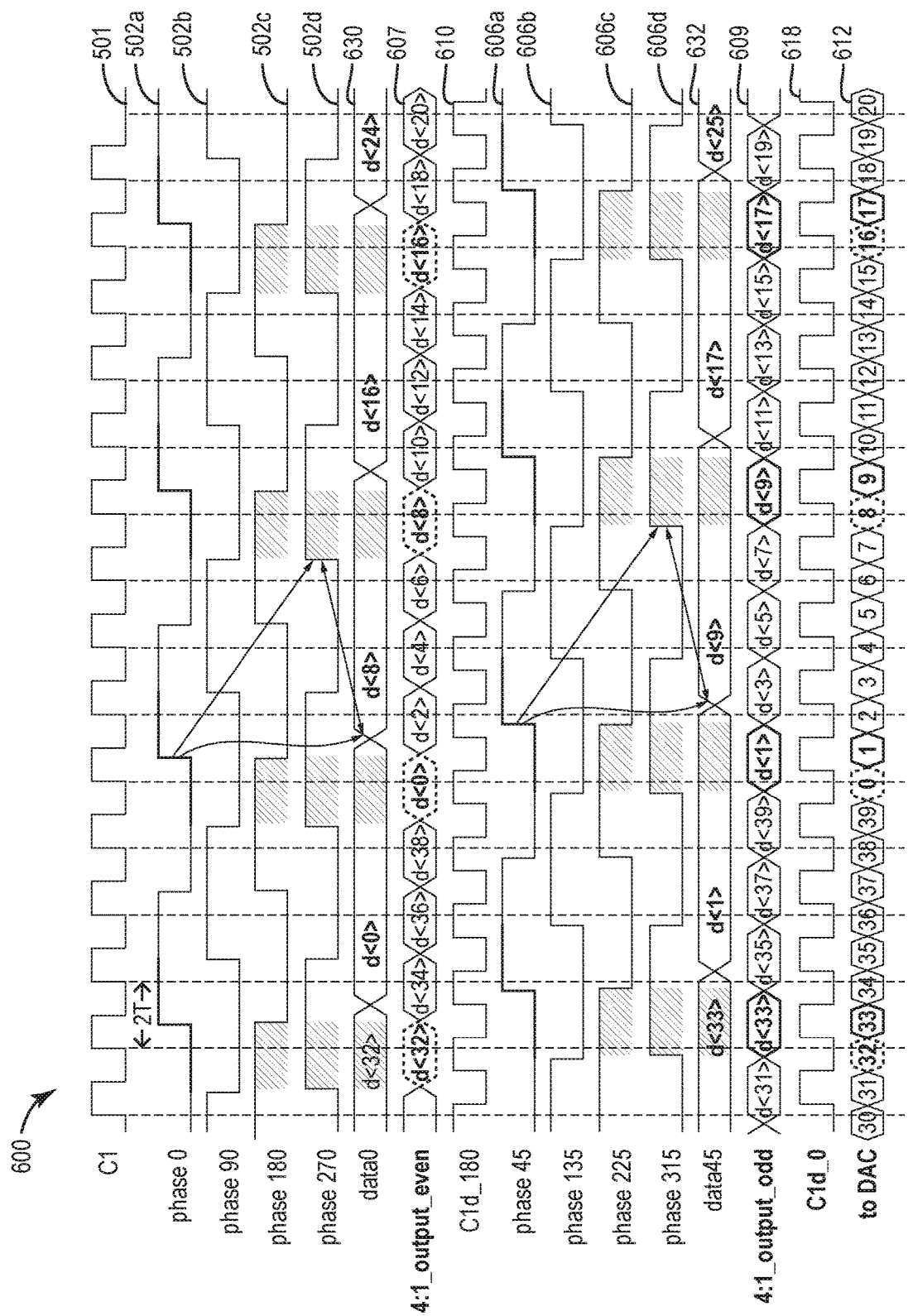
FIG. 6 is a timing diagram for the multiplexing system illustrated in FIG. 1 according to some embodiments.

With reference to FIG. 6, the timing diagram 600 shows the clock signal C1 as the signal 501 which can be provided at the input 140. The phase zero clock signal, the 90 degree phase clock signal, the 180 phase clock signal, and the 270 phase clock signal are provided for the MUX 116 and shown as the signals 502$a$-$d$, respectively. The 45 degree phase clock signal, the 135 degree phase clock signal, a 225 degree phase clock signal and a 315 degree phase clock signal are provided for the MUX 114 and are shown as signals 606$a$-$d$. An output of the MUX circuit 120 is provided as data signal 612. An output of the MUX 116 is provided as a data signal 607 and an output of the MUX 114 is provided as a data signal 609. Exemplary input data for example for data zero input of the MUX 116 is shown as signal 630 (signal data0 in FIG. 2 or the signal O0 (the signal 720$e$) in FIG. 7) and exemplary input data for example for the first input of the MUX 114 is shown as signal 632 (e.g. data 45). The clock signal C1$d$ is shown as an exemplary signal 618.

The disclosure is described above with reference to drawings. These drawings illustrate certain details of specific embodiments that implement the systems and methods and programs of the present disclosure. However, describing the disclosure with drawings should not be construed as imposing on the disclosure any limitations that are present in the drawings. No claim element herein is to be construed as a "means plus function" element unless the element is expressly recited using the phrase "means for." Furthermore, no element, component or method step in the present disclosure is intended to be dedicated to the public, regardless of whether the element, component or method step is explicitly recited in the claims.

It should be noted that certain passages of this disclosure can reference terms such as "first" and "second" in connection with power level for purposes of identifying or differentiating one from another or from others. These terms are not intended to related entities or operations (e.g., a first power level and a second power level) temporally or according to a sequence, although in some cases, these entities can include such a relationship. Nor do these terms limit the number of possible entities or operations.

It should be noted that although the timing and operations provided herein show a specific order of operations and signals, it is understood that the order of these signals and operations can differ from what is depicted. Also, two or more signals or operations can be performed concurrently or with partial concurrence. Such variation will depend on the software and hardware systems chosen and on designer choice. It is understood that all such variations are within the scope of the disclosure. The timing diagrams 500, 600, and 700 are exemplary.

While the foregoing written description of the methods and systems enables one of ordinary skill to make and use what is considered presently to be the best mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. A multiplexing system, comprising:
  a data serializer having a first set of four serializer outputs and a second set of four serializer outputs;
  a first 4 to 1 multiplexer having four first multiplexer inputs and one first multiplexer output, the first multiplexer inputs being coupled to the first set of four serializer outputs;
  a second 4 to 1 multiplexer having four second multiplexer inputs and one second multiplexer output, the second multiplexer inputs being coupled to the second set of four serializer outputs; and a 2 to 1 multiplexer having two third multiplexer inputs and one third multiplexer output, the first multiplexer output being coupled to one of the third multiplexer inputs and the second multiplexer output being coupled to the other of the third multiplexer inputs, wherein the 2 to 1 multiplexer receive a first clock signal at a first rate, and the first 4 to 1 multiplexer and the second 4 to 1 multiplexer receive a second clock signal at a second rate, the first rate being four times as fast as the second rate, wherein the first 4 to 1 multiplexer selects data according to a first set of four of eight phase signals derived from the second clock signal and the second 4 to 1 multiplexer selects data according to a second set of four of the eight phase signals derived from the second clock signal.

2. The multiplexing system of claim 1, wherein the first set of the four of the eight phase signals comprises phases 0, 90, 180 and 270.

3. The multiplexing system of claim 2, wherein the second set of the four of the eight phase signals comprises phases 45, 135, 225 and 315.

4. The multiplexing system of claim 1, wherein the first set of the four of the eight phase signals comprises phases 90 degrees apart from each other and wherein the second set of the four of the eight phase signals phases comprises phase signals 90 degrees apart from each other and not equal to any of the first set of the four of the eight phase signals.

5. The multiplexing system of claim 1, further comprising:
a first latch between the first multiplexer output and the one of the two third multiplexer inputs; and
a second latch between the second multiplexer output and the other of the two third multiplexer inputs.

6. The multiplexing system of claim 1, wherein the first set of four serializer outputs are directly coupled to the four first multiplexer inputs and the second set of four serializer outputs are directly coupled to the four second multiplexer inputs.

7. The multiplexing system of claim 1, wherein the first 4 to 1 multiplexer comprises a set of four first inverters respectively connected to the first multiplexer inputs and a set of four second inverters coupled to the four second multiplexer inputs.

8. The multiplexing system of claim 7, wherein the set of four first inverters have first inverter outputs respectively connected to a first set of four pass gates and the set of four second inverters have four second inverter outputs respectively connected to a second set of four pass gates, the first set of the four pass gates being controlled by enable signals derived from the first four of the eight phase signals and the second set of the four pass gates being controlled by enable signals derived from the second four of the eight phase signals.

9. The multiplexing system of claim 8, further comprising an enable circuit configured to provide the enable signals, the enable circuit comprising a first set of four pass gates and a second set of four pass gates, wherein each of the pass gates is controlled by opposite phases of the four of the eight signals the second clock signal and passes an inverted signal of one of the four of the eight phase signals of the second clock signal.

10. The multiplexing system of claim 1, wherein the data serializer comprises:
a set of latches coupled in series clocked by two phase signals of the eight phase signals for each serializer output.

11. A method of serializing data, the method comprising:
receiving at four first multiplexer inputs of a first 4 to 1 multiplexer a first set of first four bits;
receiving at four second multiplexer inputs of a second 4 to 1 multiplexer a set of second four bits;
providing one of the first four bits to a first multiplexer output of the first 4 to 1 multiplexer coupled to a third multiplexer input of a 2 to 1 multiplexer in response to four first phase signals of a second clock signal;
providing one of the second four bits to a second multiplexer output of the second 4 to 1 multiplexer coupled to a fourth multiplexer input of the 2 to 1 multiplexer in response to four second phase signals of the second clock signal;
providing the one of the first four bits at the third multiplexer input to a third multiplexer output of the 2 to 1 multiplexer in response to a first clock signal; and
providing the one of the second four bits at the fourth multiplexer input to the third multiplexer output of the 2 to 1 multiplexer in response to the first clock signal, wherein the first clock signal is at a first rate, and the second clock signal is at a second rate, the first rate being four times as fast as the second rate.

12. The method of claim 11, wherein the one of the first four bits and the one of the second four bits are provided as differential signals.

13. The method of claim 11, further comprising applying logic to the four first phase signals to provide eight enable signals, wherein the eight enable signals are used to provide the one of the first four bits to the first multiplexer output as a differential signal.

14. The method of claim 13 wherein the eight enable signals have a pulse width of a period of the first clock signal.

15. The method of claim 11, the four first phase signals comprise phases 0, 90, 180 and 270 of the second clock signal and the four second phase signals comprises phases 45, 135, 225 and 315 of the second clock signal.

16. The method of claim 11, wherein the first multiplexer output of the first 4 to 1 multiplexer is coupled to the third multiplexer input of the 2 to 1 multiplexer through a first latch, the first latch receiving a first phase of the first clock signal, and wherein the second multiplexer output of the second 4 to 1 multiplexer is coupled to the fourth multiplexer input of the 2 to 1 multiplexer through a second latch, the second latch receiving a second phase of the first clock signal.

17. The method of claim 16, wherein the second phase is 180 degrees from the first phase.

18. A communication integrated circuit, comprising:
a first 4 to 1 multiplexer having four first multiplexer inputs and one first multiplexer outputs;
a second 4 to 1 multiplexer having four second multiplexer inputs and one second multiplexer outputs; and
a 2 to 1 multiplexer having two third multiplexer inputs and one third multiplexer output, the first multiplexer output being coupled to one of the third multiplexer inputs and the second multiplexer output being coupled to the other of the third multiplexer inputs, wherein the 2 to 1 multiplexer is clocked by a first clock signal at a first rate, and the first 4 to 1 multiplexer and the second 4 to 1 multiplexer receive a second clock signal at a second rate, the first rate being four times as fast as the second rate, wherein the first 4 to 1 multiplexer selects data according to a first set of four of eight phase signals of the second clock signal and the second 4 to 1 multiplexer selects data according to a second set of four of the eight phase signals of the second clock signal.

19. The communication integrated circuit of claim 18, further comprising:
a first latch between the first multiplexer output and the one of the two third multiplexer inputs; and
a second latch between the second multiplexer output and the other of the two third multiplexer inputs, wherein the first 4 to 1 multiplexer comprises a set of four first inverters respectively connected to the first multiplexer inputs and a set of four serially connected inverter pairs coupled to the second multiplexer inputs, wherein the set of four first inverters have first inverter outputs respectively connected to a first set of four pass gates and the set of four second serially connected inverter pairs have second inverter outputs respectively connected to a second set of four pass gates, the first set of the four pass gates being controlled by enable signals derived from first four of the eight phase signals of the second clock signal and second set of four pass gates being controlled by the enable signals derived from the first four of the eight phase signals of the second clock signal.

20. The communication integrated circuit of claim 19, further comprising an enable circuit configured to provide the enable signals, the enable circuit comprising a first set of four pass gates and a second set of four pass gates, wherein each of the pass gates is controlled by opposite phases of one of the first four of the eight phases signals of the second clock signal and passes an inverted signal of one of the first four of the eight phase signals of the second clock signal.

* * * * *